United States Patent [19]

Ohta et al.

[11] Patent Number: 5,384,538

[45] Date of Patent: Jan. 24, 1995

[54] MAGNETIC FIELD GENERATION DEVICE FOR USE IN SUPERCONDUCTIVE TYPE MRI

[75] Inventors: Kimiharu Ohta, Amagasaki; Masahiro Yuki, Osaka, both of Japan

[73] Assignee: Sumitomo Special Metals Co., Ltd., Osaka, Japan

[21] Appl. No.: 99,599

[22] Filed: Jul. 30, 1993

[30] Foreign Application Priority Data

Feb. 5, 1993 [JP] Japan .................................. 5-041834

[51] Int. Cl.⁶ .............................................. G01R 33/20
[52] U.S. Cl. .................................. 324/319; 324/318; 335/299
[58] Field of Search ................... 324/319, 320, 318; 335/296–301; 128/653.5, 653.2

[56] References Cited

U.S. PATENT DOCUMENTS

| | | | |
|---|---|---|---|
| 4,359,706 | 11/1982 | Flack | 335/297 |
| 4,374,360 | 2/1983 | Flack | 324/320 |
| 4,679,022 | 7/1987 | Miyamoto et al. | 324/319 |
| 4,777,464 | 10/1988 | Takabatashi et al. | 324/318 |
| 4,827,235 | 5/1989 | Inomata et al. | 335/297 |
| 5,134,374 | 7/1992 | Breneman et al. | 324/319 |

FOREIGN PATENT DOCUMENTS 3180007A 8/1991 Japan ..................... 335/296

*Primary Examiner*—Kenneth A. Wieder
*Assistant Examiner*—Raymond Y. Mah
*Attorney, Agent, or Firm*—Watson, Cole, Grindle & Watson

[57] ABSTRACT

An improved magnetic field generating device for use with a medical nuclear magnetic resonance tomographic device (MRI). The device comprises a magnetic circuit formed of a pair of magnetic pole pieces connected by yoke members in opposite relationship with each other leaving a space sufficient to accommodate therebetween an object receiving a medical inspection. According to the present invention, a super-conductive coil is wound around one of the pairs of magnetic pole pieces and the dimensional relationship between the two magnetic pole pieces is varied in a variety of ways to reduce the magnetic field imbalance, with the advantages that the magnetic flux distribution becomes highly uniform throughout the space between the pair of magnetic pole pieces, the patient entering the space has no oppressive sensation and the manufacturing cost can be reduced to a considerable degree.

5 Claims, 8 Drawing Sheets

5,384,538

MAGNETIC FIELD GENERATION DEVICE FOR USE IN SUPERCONDUCTIVE TYPE MRI

BACKGROUND OF THE INVENTION

1. Field of the Invention

The present invention concerns an improvement in a magnetic field generation device using superconductive coils used, for example, in medical nuclear magnetic resonance tomographic device (hereinafter referred to as MRI), and more particularly, it relates to a magnetic field generation device used for superconductive type MRI which is relatively inexpensive and capable of forming a magnetic field having a high uniformity in a predetermined space required for medical use.

2. Description of the Prior Art

MRI is a device in which a person to be inspected is partially or wholly inserted into a gap of a magnetic generation device forming an intense magnetic field to obtain a tomographic image of an object and which can draw out as far as the nature of the tissues thereof.

The magnetic field generation device for use in MRI includes a permanent magnet type, a normally conductive type and a superconductive type, among which the superconductive type has been used generally so far since an extremely high magnetic field of 0.5–2 T(Tesla) can be obtained stably.

In the superconductive type MRI, since a person to be inspected has to be inserted in an intense static magnetic field, cylindrical coils such as solenoid coils or Hemlholtz's coils are usually formed and the person to be inspected is inserted into a cylindrical space defined by the coils and the axial direction of the cylindrical space aligns with a body axis of the person to be inspected.

The coils of the aforementioned construction entails the problem that opening portions of the device are small and disposed only at two positions, and the required uniformity of magnetic field cannot be obtained unless the length along the depth of the device is extended for taking images of high quality, so that a psychological oppressive sensation is caused to the person to be inserted as the length in the direction of the depth of the device is increased.

As a construction of relatively reduced length along the direction of the depth of the devices compared with the construction of using the cylindrical coils described above, a superconductive type MRI has been proposed in which a pair of magnet pole pieces having superconductive coils disposed circumferentially are opposed to each other to define a predetermined gap therebetween See U.S. Pat. No. 4,766,378. However, also in this construction, since a pair of magnet pole pieces are disposed on a disc-like yoke disposed on the both ends of a short cylindrical yoke and a person to be inspected is inserted from an opening formed to the outer circumference of the short cylindrical yoke as shown in FIG. 14, no substantial reduction in the psychological oppressive sensation is obtained.

In either of the constructions using the cylindrical coils or a pair of magnet pole pieces as described above, it has been keenly demanded to reduce the psychological oppressive sensation to the person to be inspected. Furthermore, since superconductive coils are used as a magnetic field generation source, it is indispensable to provide a cooling device for keeping the coils, for example, to a temperature of liquid helium, i.e., a cryogenic temperature, so that effective arrangement and construction of the superconductive coils has keenly been demanded in order to reduce the cost of the superconductive type MRI.

However, in the superconductive type MRI using, for example, a pair of magnetic pole pieces as described above, since a pair of expensive superconductive coils are necessary and if a single-side excitation system is adopted in which superconductive coils are disposed circumferentially to only one of the opposed paired coils, merely with an aim of reducing the cost, the magnetic field is increased on the side of the magnetic pole piece having the superconductive coils disposed circumferentially and, accordingly, imbalance of the magnetic field occurs in the vertical direction the magnetic field uniformity in the predetermined space in which the person to be inserted is worsened extremely.

It is an object of the present invention to provide a magnetic field generation device for use in a superconductive type MRI using a relatively inexpensive construction in which superconductive coils are disposed circumferentially to only one of a pair of magnet pole pieces opposed to each other, and which is capable of satisfying a required high magnetic field uniformity for medical use and has an open construction with such a large opening as not giving a psychological oppressive sensation to a person to be inspected.

SUMMARY OF THE INVENTION

The present inventors have made various studies on a construction of a superconductive type MRI in which superconductive coil is disposed circumferentially only to one of a pair of magnetic pole pieces opposed to each other and which can obtained a high magnetic field uniformity in a required space formed between a pair of magnet pole pieces and, as a result, have accomplished the present invention based on the finding that vertical imbalance is caused to the magnetic field since the magnetic field on the side of one of the magnetic pole pieces having superconductive coil disposed circumferentially is increased and this extremely worsens the magnetic field uniformity, but such imbalance in the magnetic field can be improved by making the outer diameter of magnetic pole piece having the superconductive coil disposed circumferentially greater than the outer diameter of the other magnetic pole piece not having the superconductive coil.

That is, the present invention provides a magnetic field generation device for use in a superconductive type MRI comprising a magnetic circuit in which a pair of magnet pole pieces are opposed to each other with a predetermined gap defined therebetween are connected by way of yokes, and in which superconductive coil is disposed circumferentially only to one of the magnet pole pieces, wherein the outer diameter of the magnet pole piece having the coils disposed circumferentially is made greater than the outer diameter of the other the magnet pole pieces.

Further, it has been confirmed that psychological oppressive sensation given to a person to be inspected can be reduced remarkably by adapting the constitution for the magnetpole pieces as described above and by further adapting the yokes for connecting a pair of magnet pole pieces to define a magnetic circuit such that the yokes comprise a pair of plate-like yokes each having magnet pole piece attached to the inside thereof and four stud-like yokes for opposing the plate-like yokes to each other at a predetermined gap since the circumferential direction is largely opened to a required space having the high magnetic field uniformity.

The magnet pole piece not having the superconductive coil disposed circumferentially may be in any of shapes and, particularly, magnetic field uniformity can be improved further by disposing a shim-like annular protrusion to the outer circumference and disposing a disc-like protrusion to a central portion of a gap opposing face, and it is desirable that magnet pole pieces are properly selected depending on the required magnetic field uniformity or the like including various specific constructions of magnet pole pieces having superconductive coil disposed circumferentially to be described later.

DESCRIPTION OF THE PREFERRED EMBODIMENTS

Figure 1:
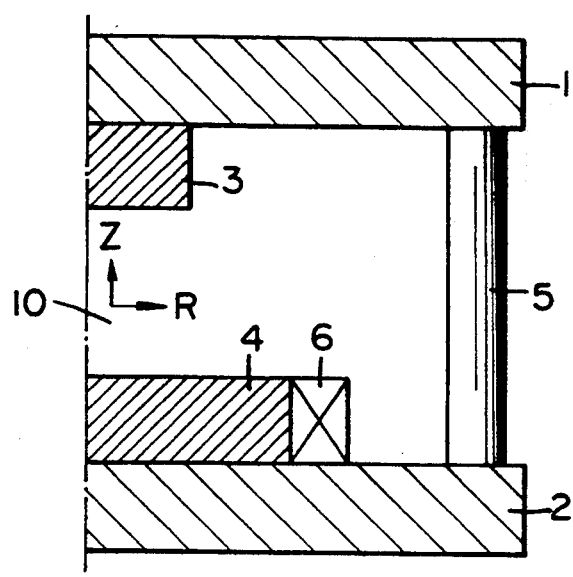
FIG. 1 is an explanatory vertical cross sectional view illustrating a preferred embodiment of a magnetic field generation device according to the present invention.
Figure 2A:
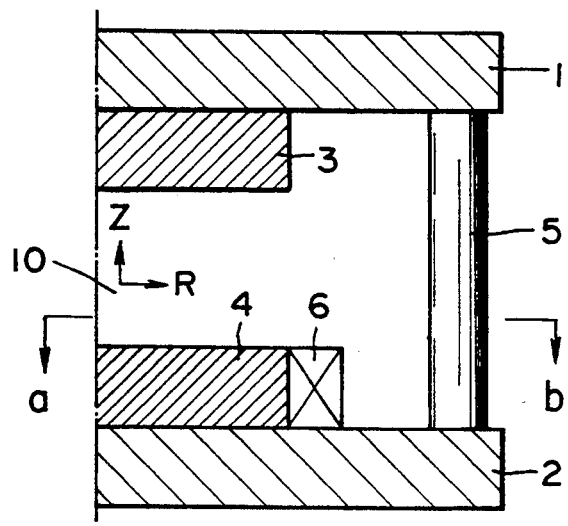
FIG. 2 A and B are explanatory vertical cross sectional view and plan view showing a comparative embodiment.

Descriptions will now be made specifically to the operation of the magnetic field generation device for use in a superconductive type MRI according to the present invention with reference to the drawings. FIG. 1 is an explanatory vertical cross sectional view illustrating an example of a magnetic field generation device according to the present invention, FIGS. 2 A and B are explanatory vertical cross sectional views showing the construction of a comparative embodiment and an explanatory cross sectional view taken along line a—a in FIG. 2A. FIG. 3 through FIG. 8 are explanatory vertical cross sectional views illustrating other embodiments of the magnetic field generation device according to the present invention.

Figure 2B:
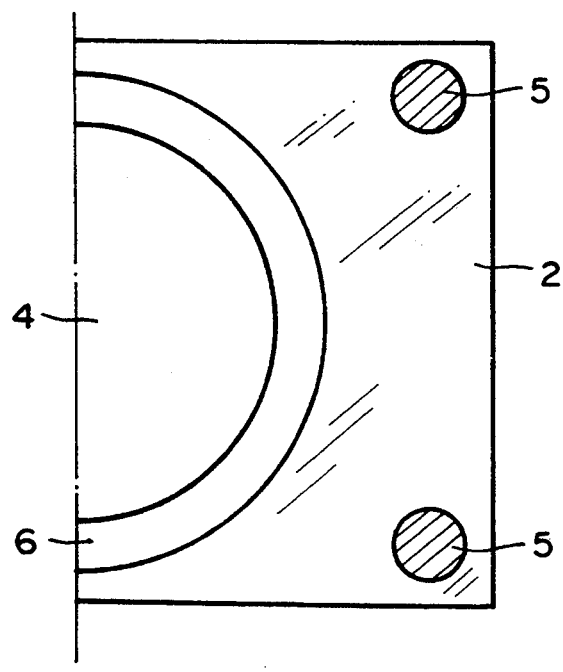

In the magnetic field generation device shown in FIGS. 2 A and B, a pair of yoke plates 1, 2 are opposed to each other by way of four stud-like yokes 5. Disc-like magnet pole pieces 3, 4, each of an identical outer diameter, are disposed at the central portion of the opposing face for each of the yoke plates 1, 2, in which a space 10 is defined, and superconductive coil 6 is disposed circumferentially only to the lower magnet pole piece 4 in the opposed pair of magnet pole pieces 3, 4. Since the magnetic field on the side of the magnet pole piece 4 having the superconductive coil 6 disposed circumferentially is increased, vertical imbalance is caused in the vertical magnetic field to very much worsen the magnetic field uniformity.

In view of the above, the outer diameter of the lower magnet pole piece 4 having the superconductive coil 6 disposed circumferentially as in the magnetic field generation device shown in FIG. 2 is made greater than the outer diameter of the upper magnet pole piece 3 not having the superconductive coil 6, by which the vertical imbalance in the magnetic field can be improved to make the magnetic field uniformity satisfactory.

The outer diameter of the lower magnet pole piece 4 having the super conductive coil 6 disposed circumferential may be made greater than the outer diameter of the other magnet pole piece 3, by properly selecting the outer diameter ratio between a pair of magnet pole pieces 3, 4 depending, for example, on the construction of the magnetic circuit and the required magnetic field uniformity, for example, by merely increasing the diameter of the lower magnet pole piece 4 or by decreasing the outer diameter of the other magnet pole piece 3, thereby relatively increasing the outer diameter of the lower magnet pole piece 4. In FIGS. 1 and 2, the cooling device and the like for the superconductive coil 6 are omitted for easy understanding of the feature of the present invention, which is the same also in other embodiments.

Figure 3:
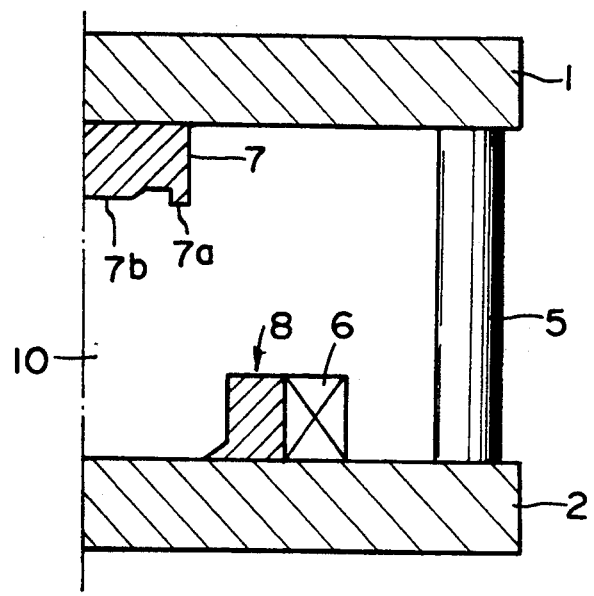
FIG. 3 through FIG. 8 are explanatory vertical cross sectional views illustrating other preferred embodiments of the magnetic field generation device according to the present invention.

In the magnetic field generation device shown in FIG. 3, two yoke plates 1, 2 are opposed by way of four stud-like yokes 5 and a pair of magnet pole pieces are attached to the central portion of the opposing face for each of the yoke plates 1, 2, in which an annular protrusion 7a is protruded along the outer circumference and a disc-like protrusion 7b of a trapezoidal cross section is disposed to a central portion to a gap opposing face of the upper disc-like magnet pole 7, while an annular magnet pole piece having an outer diameter greater than the outer diameter of the upper magnet pole piece 7 is disposed as a lower magnetic pole piece 8.

Different from the upper magnet pole piece 7, the lower magnet pole piece 8 is formed by directly attaching the annular magnet pole piece to the yoke plate 2 and superconductive coil 6 is disposed circumferentially to the outer circumference thereof.

A magnetic field of an extremely high uniformity can be generated in a required space formed in a gap 10 by a construction of using an annular magnet pole piece having a greater outer diameter than the outer diameter of the other magnet pole piece 7 to one magnet pole piece 8 and circumferentially disposing the superconductive coil 6 to the outer circumference thereof.

Figure 4:
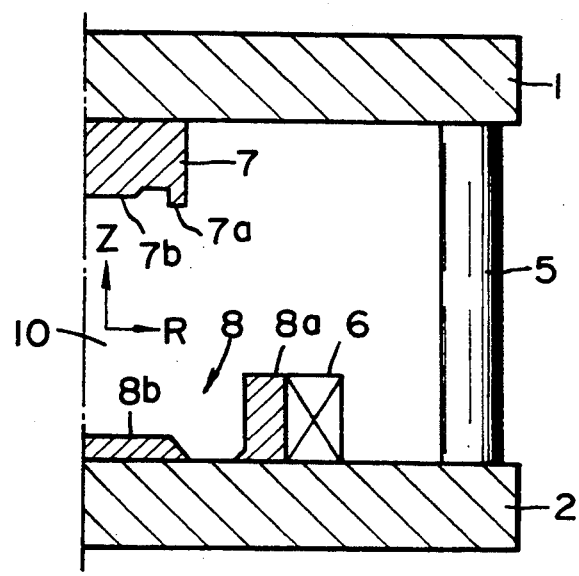

The magnetic field generation device shown in FIG. 4 has a construction like that the magnetic field generation device shown in FIG. 3 in which a disc-like magnet pole piece portion is further added as a lower pole piece having superconductive coil 6 disposed circumferentially.

That is, the lower pole piece 8 comprises an annular pole piece portion 8a and a disc-like pole piece portion 8b attached independent of each other to the yoke plate 2, in which the annular pole piece portion 8a and the disc-like pole piece portion 8b are disposed substantially coaxially, and superconductive coil 6 is disposed circumferentially to the outer circumference of the annular pole piece portion 8a situated to the outside.

This construction can generate a magnetic field of higher magnetic field uniformity in a required space than that of the construction shown in FIG. 3, by selecting the size and the dimension of the disc-like pole piece portion 8b disposed at the central portion.

Figure 5:
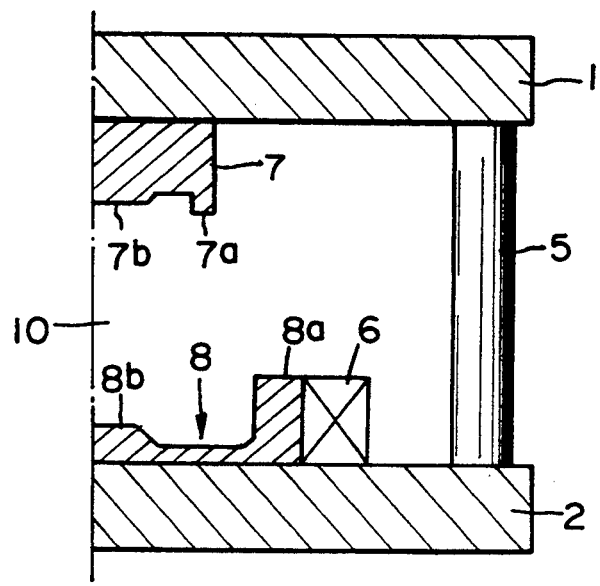

In the magnetic field generation device shown in FIG. 5, the annular pole piece portion 8a and the disc-like pole piece portion 8b shown in FIG. 4 are previously formed as a one piece structure (shown in FIG. 4)

by which positional accuracy between each of the components can be stably maintained.

It will be apparent also from the drawing that the construction of the lower magnetic pole piece having the superconductive coil 6 disposed circumferentially is substantially identical with the construction of the upper magnet pole piece not having the superconductive coil 6 disposed circumferentially except for their outer diameter.

Figure 6:
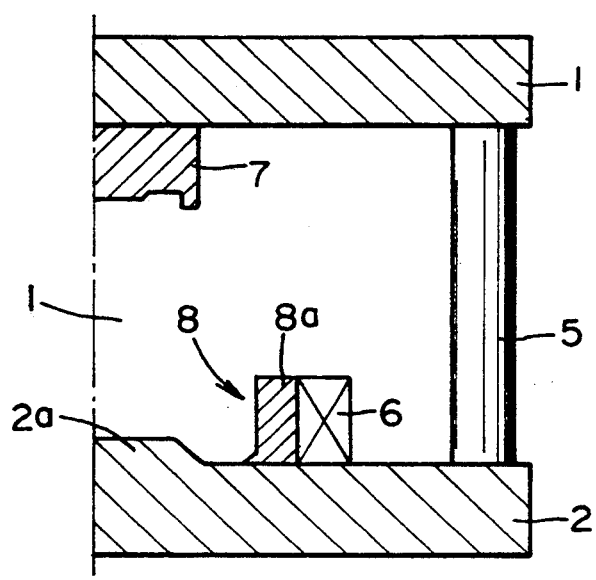

The magnetic field generation device shown in FIG. 6 can provide substantially the same effect as the shown in FIG. 4 in which the disc-like pole piece portion 8b as a portion of the lower magnet pole piece 8 in the construction shown in FIG. 4 is replaced with a protrusion 2a, corresponding to the disc-like pole piece portion 8b, is previously formed to a central portion of a yoke plate 2.

In particular, in a case where the height of the protrusion 2a is low and the outer diameter is large, it can be formed easily without reducing the fabrication yield of the yoke plate 2.

Figure 7:
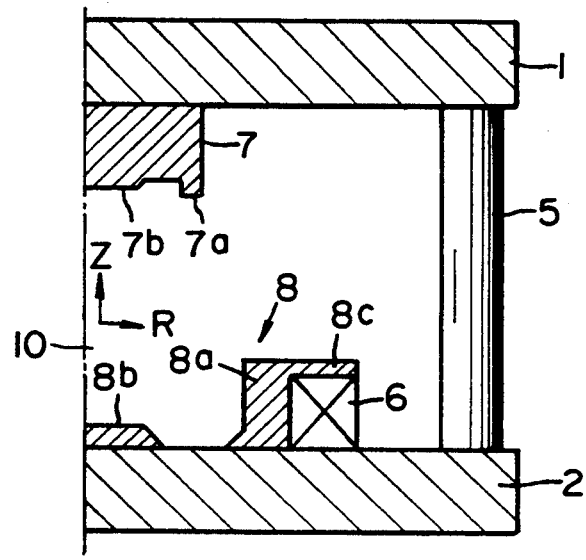

Further, in a magnetic field generation device shown in FIG. 7, a flange 8c extending outwardly is disposed to a gap opposing face of the annular pole piece portion 8a of a magnet pole piece 8 having superconductive coil 6 disposed circumferentially in a construction similar to that shown in FIG. 4 described above, so that the outer diameter of the magnet pole piece 8 is made substantially greater to thereby further improve the magnetic field uniformity than that in the construction of FIG. 4.

The degree of extension of the flange 8c is properly selected depending, for example, on the construction of the magnetic circuit, or the required magnetic field intensity or the like and it is desirable for the improvement of the magnetic field intensity that the extension can cover at least the portion of the superconductive coil 6 on the side opposing the gap. Also in the magnetic field generation device shown in FIG. 3, 5 or 6, the same effect can be obtained by disposing a flange to the annular pole piece portion.

Figure 8:
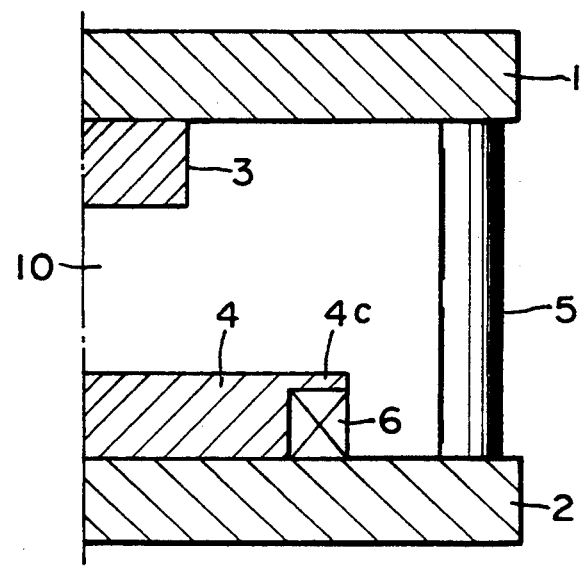

Further, also in the magnetic field generation device shown in FIG. 1, a flange 4c extending outward may be disposed to the outer circumference of the gap opposing face of the magnet pole piece 4 per se having superconductive coil 6 disposed circumferentially so as to cover the side of the superconductive coil 6 opposing to the gap as shown in FIG. 8. to function it substantially as an annular protrusion and make the outer diameter of the magnet pole piece greater than the outer diameter of the other magnet pole piece, by which the uniform magnetic field space can further be improved.

In the embodiments described above, although descriptions have been made to a case of contructing the yoke and the magnet pole pieces by separate members, various other constitutions may be employed, for example, such that a portion of the magnet pole piece is previously formed integrally to the yoke as shown in FIG. 6, or only the magnetic pole piece on the side not having the superconductive coil 6 disposed circumferentially is previously formed integrally to the yoke, while considering the shape and the size of the magnet pole piece, fabricability and assembling operability.

Figure 9:
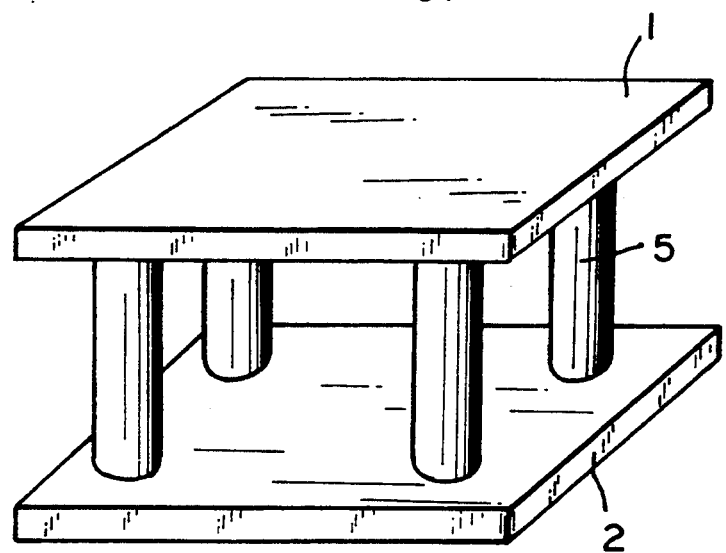
FIGS. 9 and 10 are explanatory perspective views showing ways of assembling yoke members.
Figure 10:
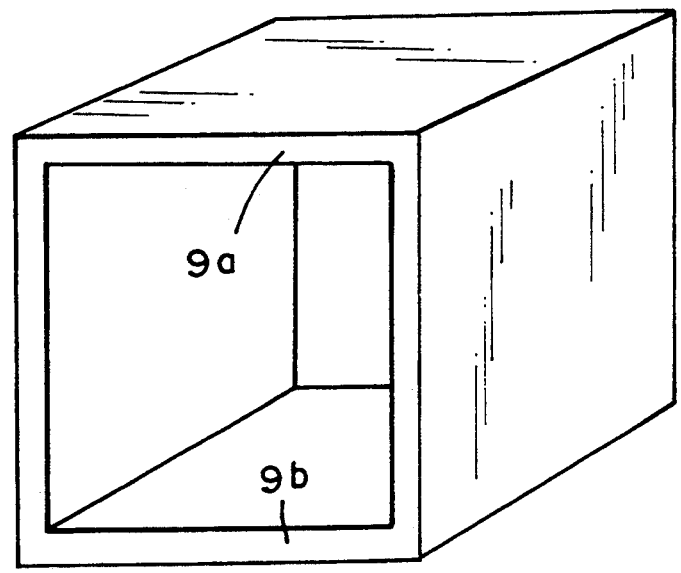

In addition, although descriptions have been made for each of the embodiments with respect to a constitution in which a pair of plate-like yokes 1, 2 and four stud-like yokes 5 are used as shown in the explanatory perspective view shown in FIG. 9, the similar effect can also be obtained by using a rectangular yoke as shown in the perspective explanatory view of FIG. 10 and using the constitution of the magnet pole pieces shown in the foregoing embodiments to the inside of a pair of plate-like yokes 9a, 9b opposed to each other. However, in order to reduce the psychological oppressive sensation to the person to be inspected, it is desirable for the constitution of using four stud-like yokes as shown in FIG. 9.

Further, as the material for the yoke or the magnet pole piece, soft magnetic material such as pure iron is used usually. In order to decrease the eddy current caused under the effect of declined or inclined magnetic field coils disposed near the magnet pole piece, the portion of the magnet pole piece opposing to the gap may be formed with soft ferrite or silicon steel plate or the like.

EXAMPLE

Example 1

When an experiment was conducted by using the magnetic field generation device shown in FIG. 1 for generating a magnetic field of 3,500 G in a space of 30 cm DSV by applying a DC current to superconductive coil at a gap of 60 cm, a magnetic field of 3,600 G was obtained at a current of 174 KAT but the magnetic field was more intense in the lower side to cause a remarkable imbalance for the magnetic field in the veritcal direction (z).

Figure 11:
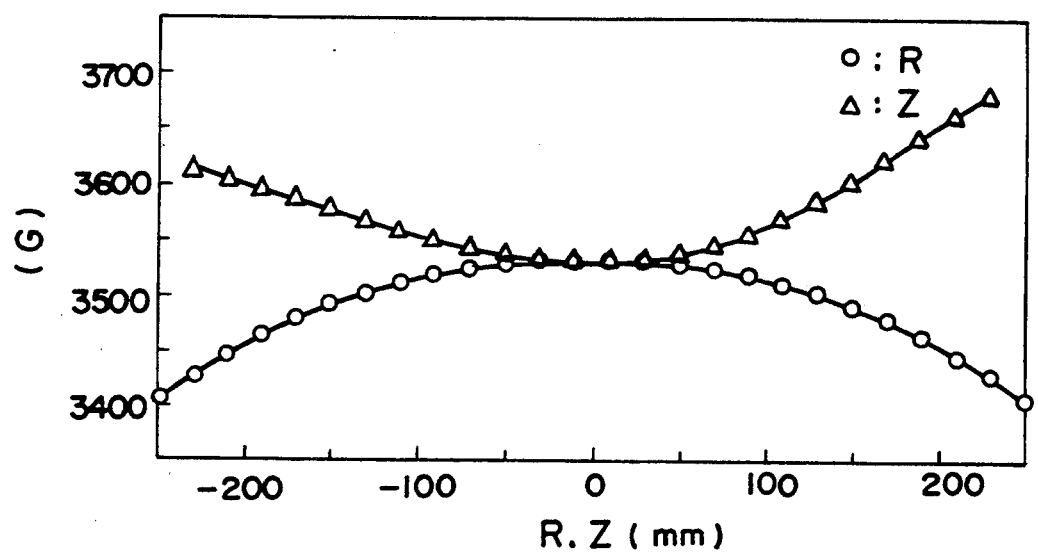
FIG. 11 through FIG. 13 are graphs illustrating the magnetic field distribution in the magnetic field generation device according to the present invention.

Then, when a similar experiment was conducted by using the magnetic field generation device according to the present invention shown in FIG. 2 while decreasing the outer diameter of the upper magnetic pole piece to about ½ of the outer diameter of the lower magnetic pole piece thereby making the outer diameter of the lower magnetic pole piece relatively larger, magnetic field balance can be established in the vertical direction (z). Further, the magnetic field distribution in the vertical direction (z) Further, the magnetic field distribution in the vertical direction (z) and the magnetic field distribution in the horizontal direction (R) are shown in FIG. 11.

Example 2

Figure 12:
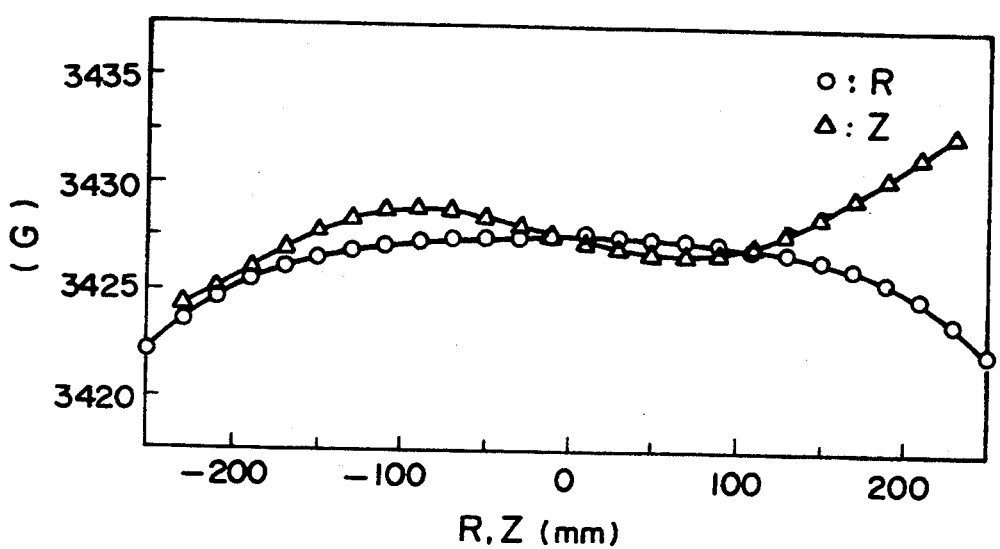

When the same experiment as in Example 1 was conducted by using the magnetic field generation device according to the present invention shown in FIG. 4, in which the annular protrusion and the disc-like protrusion were not disposed to the gap opposing face of the upper magnet pole piece and when the outer diameter ration between the upper and the lower magnet pole pieces was controlled, a magnetic field intensity of 2,000 ppm was obtained. The magnetic field distribution in the vertical direction (Z) and the magnetic field distribution in the horizontal direction (R) in FIG. 4 are shown in FIG. 12. Further, a magnetic field of 3,430 G was obtained at a current of 228 kAT.

Figure 13:
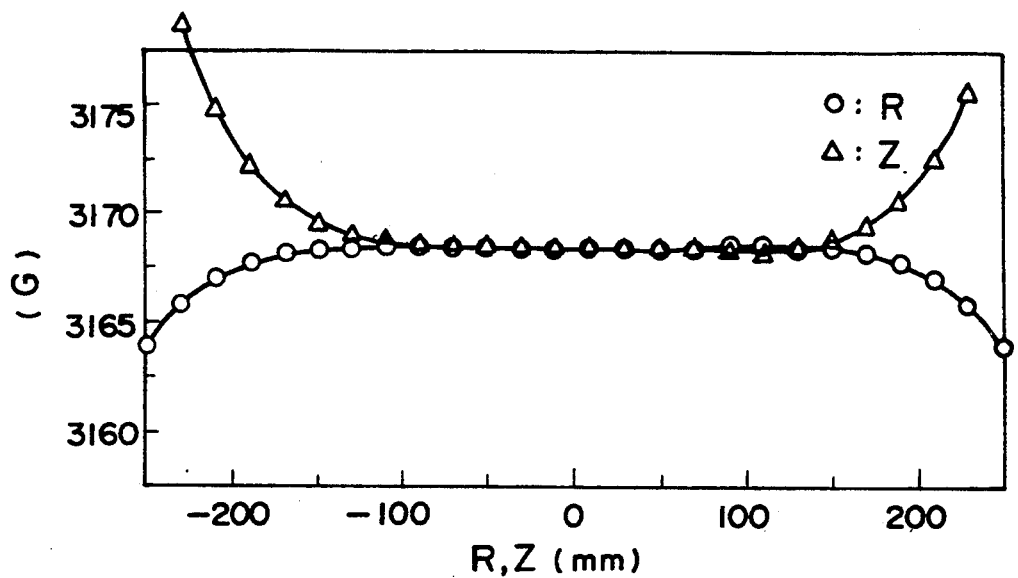
Figure 14:
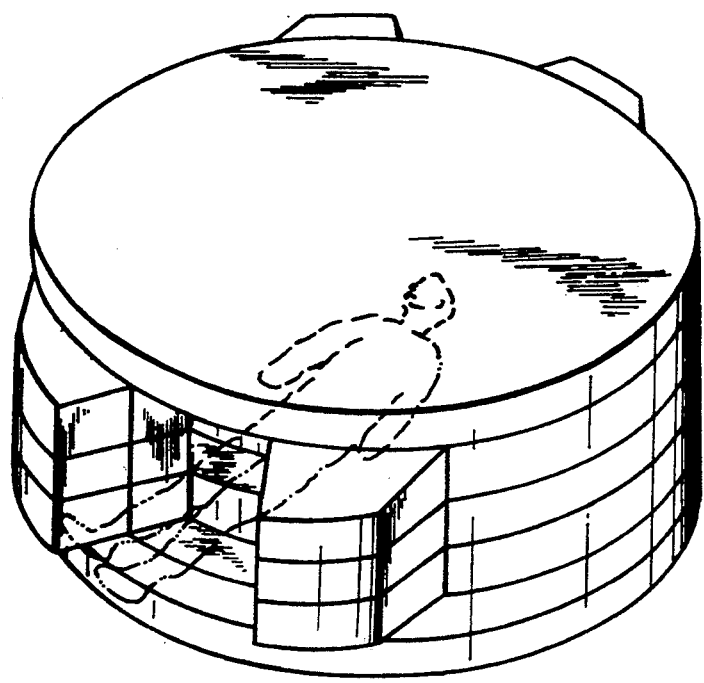
FIG. 14 is an explanatory perspective view illustrating an embodiment for the construction of a superconductive type MRI in the prior art.

Further, when the smae experiment as in Example 1 was conducted using the constitution shown in FIG. 7, in which the annular protrusion and the central protrusion were disposed to the upper magnet pole piece, while a flange extending outward so as to cover the side of the superconductive coil opposing to the gap was disposed, an extremely high magnetic field uniformity could be obtained as shown by the magnetic field distribution shown in FIG. 13.

What is claimed is:

1. A magnetic field generation device superconductive type MRI comprising:

a magnetic circuit in which a pair of magnet pole pieces are opposed to each other with a predetermined gap defined therebetween and are connected by way of yoke means, and in which a superconductive coil is disposed circumferentially only to one of the paired magnetic pole pieces, wherein the one magnetic pole piece having the circumferentially disposed superconductive coil is annular and is provided with a surface confronting a gap formed between the paired magnet pole pieces and a flange which extends outwardly to an outer peripheral portion of the gap-confronting surface, the flange having an outer diameter greater than that of another magnet pole piece, and a disk-like protrusion is disposed at a central portion of the gap-confronting surface of the annular magnet pole piece.

2. A magnetic field generation device as claimed in claim 1, wherein the annular magnet pole piece and the disk-like protrusion are one piece.

3. A magnetic field generating device as claimed in claim 1, wherein the another magnetic pole piece having no circumferentially disposed superconductive coil is of a disk-like shape and is provided with a surface confronting said gap formed between the paired magnet pole pieces and an annular protrusion on the outer peripheral portion of the gap-confronting surface.

4. A magnetic field generating device as claimed in claim 1, wherein the another magnetic pole piece having no circumferentially disposed superconductive coil is of a disk-like shape and is provided with a surface confronting said gap formed between the paired magnet pole pieces, an annular protrusion on the outer peripheral portion of the gap-confronting surface and a disk-like protrusion at a central portion of the gap-confronting surface.

5. A magnetic field generating device as claimed in claim 1, wherein yoke means connecting with one another and with a pair of magnet pole pieces to form a magnetic circuit comprise a pair of plate-like yokes, each being provided on its inside surface with one of the paired magnet pole pieces, and a plurality of columnar yokes connecting the paired plate-like yokes with a gap formed between the paired-like yokes.

* * * * *